(12) United States Patent
Black et al.

(10) Patent No.: US 7,817,760 B2
(45) Date of Patent: *Oct. 19, 2010

(54) DELAY LOCK LOOPS FOR WIRELESS COMMUNICATION SYSTEMS

(75) Inventors: Peter J. Black, San Diego, CA (US); Nagabhushana T. Sindhushayana, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/368,115

(22) Filed: Mar. 3, 2006

(65) Prior Publication Data

US 2006/0146918 A1    Jul. 6, 2006

Related U.S. Application Data

(63) Continuation of application No. 10/044,235, filed on Jan. 11, 2002, now Pat. No. 7,010,073.

(60) Provisional application No. 60/263,118, filed on Jan. 19, 2001.

(51) Int. Cl.
  *H04L 7/00*   (2006.01)
(52) U.S. Cl. .................. 375/355; 370/503; 375/227
(58) Field of Classification Search .............. 375/130, 375/316, 346–350, 354–355, 224, 227; 455/296, 455/226.1, 226.2, 226.3; 370/500, 503
See application file for complete search history.

(56) References Cited

U.S. PATENT DOCUMENTS 3,743,941 A * 7/1973 Gans et al. .................. 455/137

(Continued)

FOREIGN PATENT DOCUMENTS

EP           0620657 A1    10/1994

(Continued)

OTHER PUBLICATIONS

Jia-Chin Lin et al. "A Modified Code Tracking Loop for Direct-Sequence Spread-Spectrum Systems on Frequency-Selective Fading Channels" IEEE International Conference, Montreal, Canada, Jun. 8-12, 1997; New York, USA, Jun. 8, 1997, pp. 356-360.

(Continued)

*Primary Examiner*—Jean B Corrielus
(74) *Attorney, Agent, or Firm*—Larry J. Moskowitz

(57) ABSTRACT

Techniques for deriving sample timing for multiple signal instances received on multiple antennas for a given propagation path. In one scheme, a DLL is maintained for each path, and each DLL tracks the timing of the best signal instance for the assigned path. In another scheme, a DLL is maintained for each path, and each DLL tracks the average timing of the multiple signal instances for the assigned path. To reduce timing jitter, the SINR of a signal instance may be estimated for a number of different time offsets. The loop filter for the DLL is initially updated in the normal manner. If a change in the time offset used for the sample timing is detected, then the SINRs for the new and prior offsets are compared. The new time offset is used if the associated SINR is better. Otherwise, the prior time offset is retained and used.

12 Claims, 11 Drawing Sheets

U.S. PATENT DOCUMENTS

| | | | | |
|---|---|---|---|---|
| 4,221,005 | A | * | 9/1980 | Frosch et al. ............... 375/367 |
| 5,202,903 | A | | 4/1993 | Okanoue et al. |
| 5,325,403 | A | * | 6/1994 | Siwiak et al. ............... 375/347 |
| 5,351,274 | A | | 9/1994 | Chennakeshu et al. |
| 5,477,195 | A | * | 12/1995 | Spilker ....................... 331/11 |
| 5,550,869 | A | | 8/1996 | Gurantz et al. |
| 5,559,757 | A | * | 9/1996 | Catipovic et al. ........... 367/134 |
| 5,654,979 | A | * | 8/1997 | Levin et al. ................. 375/142 |
| 5,659,573 | A | * | 8/1997 | Bruckert et al. ............ 375/142 |
| 5,701,333 | A | | 12/1997 | Okanoue et al. |
| 5,737,362 | A | * | 4/1998 | Hyun et al. ................. 375/149 |
| 5,754,583 | A | * | 5/1998 | Eberhardt et al. ........... 375/147 |
| 5,757,844 | A | | 5/1998 | Fukawa et al. |
| 5,805,619 | A | | 9/1998 | Gardner et al. |
| 5,884,148 | A | * | 3/1999 | Bilgic et al. ............... 455/74.1 |
| 5,889,815 | A | * | 3/1999 | Iwakiri ....................... 375/148 |
| 5,930,288 | A | * | 7/1999 | Eberhardt ................... 375/148 |
| 5,953,383 | A | | 9/1999 | Kojima |
| 5,987,073 | A | * | 11/1999 | Knutson ..................... 375/326 |
| 6,085,104 | A | | 7/2000 | Kowalski et al. |
| 6,134,215 | A | * | 10/2000 | Agrawal et al. ............ 370/209 |
| 6,266,365 | B1 | * | 7/2001 | Wang et al. ................. 375/150 |
| 6,278,725 | B1 | * | 8/2001 | Rouphael et al. ........... 375/148 |
| 6,307,906 | B1 | * | 10/2001 | Tanji et al. .................. 375/376 |
| 6,330,273 | B1 | * | 12/2001 | Hulbert et al. .............. 375/150 |
| 6,335,954 | B1 | * | 1/2002 | Bottomley et al. .......... 375/354 |
| 6,359,878 | B1 | | 3/2002 | Lakkis et al. |
| 6,363,102 | B1 | * | 3/2002 | Ling et al. .................. 375/147 |
| 6,389,040 | B1 | * | 5/2002 | Viswanathan ............... 370/480 |
| 6,389,060 | B1 | * | 5/2002 | Naruse ....................... 375/130 |
| 6,392,500 | B1 | | 5/2002 | McCallister et al. |
| 6,459,883 | B2 | * | 10/2002 | Subramanian et al. ... 455/67.11 |
| 6,545,532 | B1 | | 4/2003 | Maalej et al. |
| 6,580,750 | B2 | * | 6/2003 | Aue ............................ 375/150 |
| 6,608,858 | B1 | * | 8/2003 | Sih et al. .................... 375/147 |
| 6,628,698 | B1 | * | 9/2003 | Oda ............................ 375/147 |
| 6,633,616 | B2 | * | 10/2003 | Crawford .................... 375/326 |
| 6,693,953 | B2 | | 2/2004 | Cox et al. |
| 6,704,347 | B1 | * | 3/2004 | Miura ......................... 375/150 |
| 6,735,242 | B1 | * | 5/2004 | Kenney et al. .............. 375/150 |
| 6,768,780 | B1 | * | 7/2004 | Lakkis et al. ............... 375/355 |
| 6,785,321 | B1 | * | 8/2004 | Yang et al. .................. 375/137 |
| 6,807,157 | B2 | * | 10/2004 | Chen et al. .................. 370/252 |
| 6,856,644 | B1 | * | 2/2005 | Wang et al. ................. 375/130 |
| 6,937,677 | B2 | * | 8/2005 | Strolle et al. ............... 375/347 |
| 6,970,523 | B2 | * | 11/2005 | Strolle et al. ............... 375/345 |
| 7,010,020 | B2 | * | 3/2006 | Bultan et al. ................ 375/148 |
| 2001/0010688 | A1 | * | 8/2001 | Bi et al. ...................... 370/342 |
| 2001/0017902 | A1 | | 8/2001 | Yamagata et al. |
| 2002/0057729 | A1 | * | 5/2002 | Farbod et al. ............... 375/150 |
| 2003/0058929 | A1 | | 3/2003 | Cox et al. |
| 2003/0063596 | A1 | | 4/2003 | Arsian et al. |
| 2007/0116102 | A1 | * | 5/2007 | Rowitch et al. ............. 375/148 |

FOREIGN PATENT DOCUMENTS

WO    99/39452    8/1999

OTHER PUBLICATIONS

International Search Report PCT/US02/001793, International Search Authority—European Patent Office—Aug. 21, 2002.

TIA/EIA/IS-856 v.20; "cdma2000 High Rate Packet Data Air Interface Specification", 3GPP2 C.S0024, Dec. 5, 2001.

Viterbi, "Principles of Spread Spectrum Multiple Access Communications,""Synchronization of Pseudorandom Signals", 3.5 Time Tracking of Pseudorandom Signals, 2nd Ed., pp. 60-66, McGraw Hill, 1977.

* cited by examiner

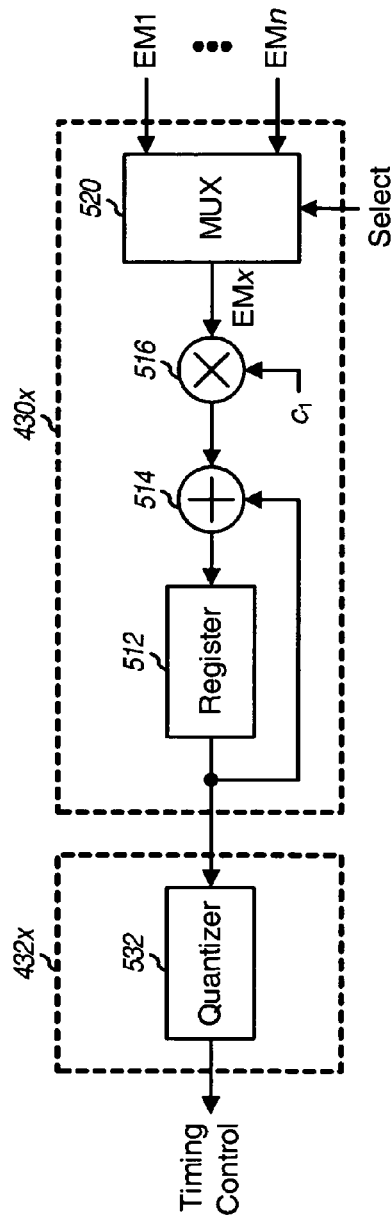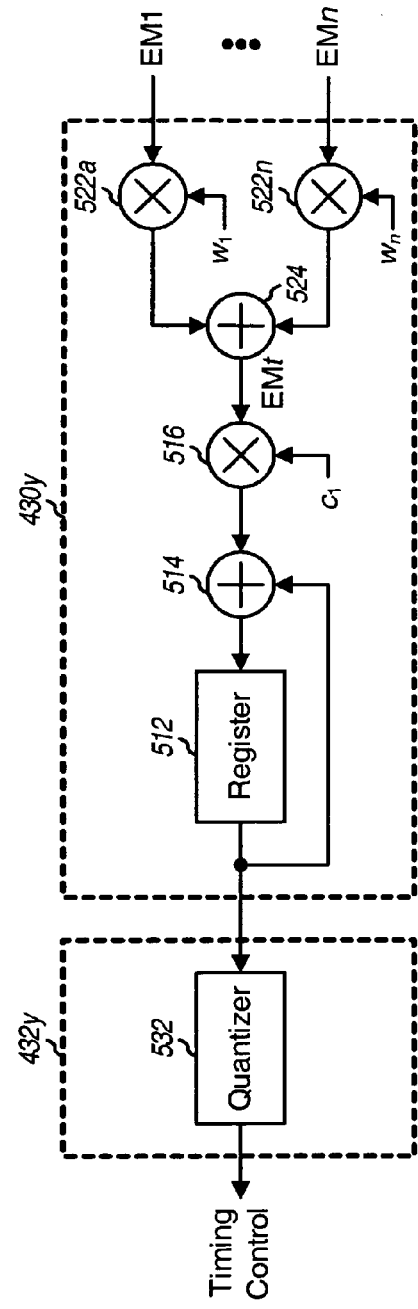

DELAY LOCK LOOPS FOR WIRELESS COMMUNICATION SYSTEMS

CLAIM OF PRIORITY UNDER 35 U.S.C. §119

The present Application for Patent claims priority to Provisional Application No. 60/263,118, entitled "Changes to RX Diversity Combining and DLL Implementation," filed Jan. 19, 2001, and assigned to the assignee hereof and hereby expressly incorporated by reference herein.

CLAIM OF PRIORITY UNDER 35 U.S.C. §120

The present Application for Patent is a Continuation and claims priority to patent application Ser. No. 10/044,235 entitled "Delay Lock Loops for Wireless Communication Systems," filed Jan. 11, 2002, now U.S. Pat. No. 7,010,073, now allowed, and assigned to the assignee hereof and hereby expressly incorporated by reference herein.

BACKGROUND

1. Field

The present invention relates generally to data communication, and more specifically to delay lock loops (DLL) for use in wireless communication systems.

2. Background

In a wireless communication system, an RF modulated signal from a transmitter may reach a receiver via a number of propagation paths (e.g., a line-of-sight path and/or reflected paths). The characteristics of the propagation paths typically vary over time due to a number of factors such as fading and multipath. To provide diversity against deleterious path effects and improve performance, multiple antennas may be used to receive the transmitted signal. If the propagation paths between the transmit antenna and the multiple receive antennas are linearly independent to at least an extent, then the likelihood of correctly receiving a data transmission increases with the use of additional receive antennas.

In a multipath environment, the signal received on each antenna may include a number of instances of the transmitted signal. If multiple receive antennas are used to provide receive diversity, then each propagation path results in a signal instance appearing at each of the multiple receive antennas. If these antennas are located within close proximity to one another, then the multiple signal instances received on these antennas for any given propagation path will be closely aligned in time but may have different (and possibly wide ranging) amplitudes and phases depending on the specific channel gains for the receive antennas.

At the receiver, each received signal is conditioned and digitized to provide a respective stream of data samples. A rake receiver may then be used to process one or more signal instances in each received signal. Improved performance may be achieved if the various signal instances in the multiple received signals can be processed and combined in a manner such that more of the signal energy is collected for a given data transmission.

One key challenge to achieving high performance is to properly sample each signal instance at the specific time instances associated with the highest signal-to-noise-and-interference ratio (SINR). If receive diversity is not used (i.e., only one receive antenna is employed), then a delay lock loop may be used to adjust the sample timing for each signal instance such that the received signal is effectively sampled (or resampled) at or near the optimum time instances. However, when receive diversity is used, certain challenges are encountered in deriving the proper sample timing for the multiple signal instances received on multiple antennas for each propagation path.

Moreover, additional challenges are encountered in deriving the proper sample timing for certain operating conditions. For a communication system designed to operate at low SINRs, such as an IS-95 CDMA system, the SINR of a signal instance is not quite as sensitive to errors or jitter in the sample timing. However, for a system designed to operate at high SINRs, such as an IS-856 CDMA system, errors or jitter in the sample timing may result in more noticeable degradation in the signal instance's SINR, which may then degrade performance.

There is, therefore, a need in the art for techniques to provide proper sample timing for receive diversity and/or high SINR operating environments.

SUMMARY

Techniques are provided herein to derive the sample timing to be used for multiple signal instances received on multiple antennas for a given propagation path when receive diversity is employed at the receiver. In one receive diversity delay lock loop (DLL) scheme, a DLL is maintained for each propagation path, and each DLL tracks the timing of the best signal instance for the assigned propagation path. The best signal instance may be the one achieving the highest signal-to-noise-and-interference ratio (SINR) among the multiple signal instances received for the propagation path. In another receive diversity DLL scheme, a DLL is maintained for each propagation path, and each DLL tracks the average timing of multiple signal instances for the assigned propagation path. The average timing for a given propagation path may be derived by (1) deriving an error metric indicative of the error in the sampling timing for each signal instance, (2) weighting the error metrics for the multiple signal instances, (3) combining the weighted error metrics for each loop update period to derive a composite error metric, and (4) updating a loop filter for the DLL with the composite error metric. For both DLL schemes, the sample timing for the multiple signal instances for each propagation path is derived by the DLL maintained for the propagation path. These and other DLL schemes are described in further detail below.

Techniques are also provided herein to provide sample timing having reduced jitter for high SINR operating environments. The SINR of a received signal instance may be estimated for a number of different time offsets, with each time offset corresponding to a different sample timing for the signal instance. The loop filter for the DLL maintained for the signal instance may initially be updated in the normal manner based on an error metric derived for the signal instance. If a change (e.g., of one or more chipx8 time units) in the time offset to be used for the sample timing is detected, then the SINR for the new time offset is compared to the SINR for the prior time offset. The new time offset is then used for the sample timing if the SINR for the new time offset is better (e.g., by y dB) than the SINR for the prior time offset. Otherwise, if the SINR for the new time offset is not better, then the prior time offset is retained and used for the sample timing. Again, various details of these techniques are described below.

Various aspects and embodiments of the invention are described in further detail below. The invention further provides methods, program codes, digital signal processors (DSPs), receiver units, terminals, base stations, systems, and other apparatuses and elements that implement various aspects, embodiments, and features of the invention, as described in further detail below.

BRIEF DESCRIPTION OF THE DRAWINGS

The features, nature, and advantages of the present invention will become more apparent from the detailed description set forth below when taken in conjunction with the drawings in which like reference characters identify correspondingly throughout and wherein:

FIGS. 5C and 5D are block diagrams of two embodiments of a first-order loop filter that may be used to track the average timing of multiple signal instances for a given propagation path;

DETAILED DESCRIPTION

Figure 1:
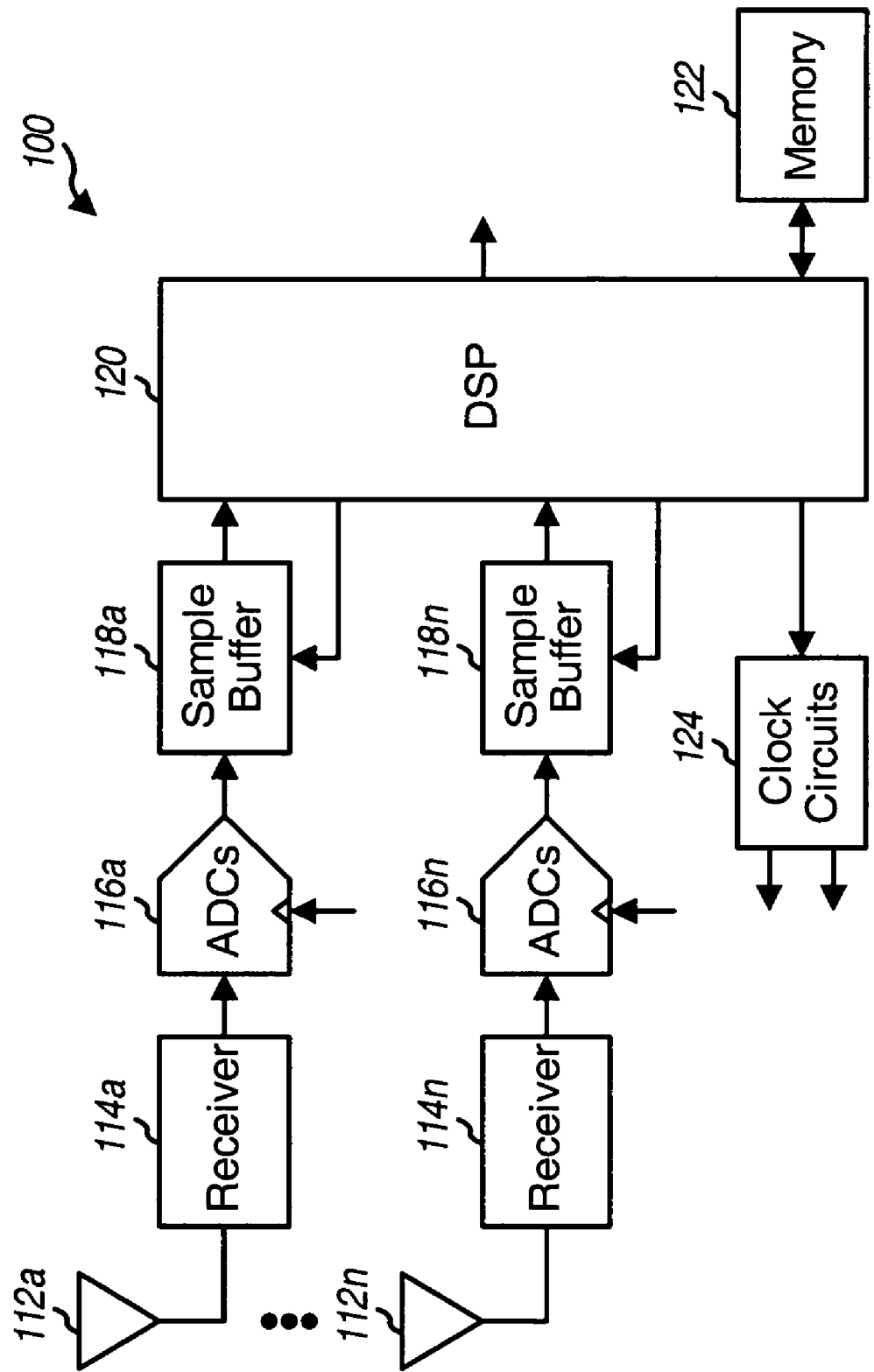
FIG. 1 is a block diagram of an embodiment of a receiver unit capable of implementing various aspects and embodiments of the invention.

FIG. 1 is a block diagram of an embodiment of a receiver unit 100 capable of implementing various aspects and embodiments of the invention. Receiver unit 100 may be implemented within a terminal (e.g., a cellular phone) or a base station. A terminal may also be referred to as a mobile station, a remote terminal, an access terminal, or some other terminology, and a base station may also be referred to as an access point, UTRAN, or some other terminology. Receiver unit 100 may also be used in various wireless communication systems such as, for example, IS-95, cdma2000, IS-856, and W-CDMA systems. For clarity, various aspects and embodiments are described below for the forward link in an IS-856 system, which is described in Document 3GPP2 C.S0024, entitled "cdma2000 High Rate Packet Data Air Interface Specification," and incorporated herein by reference.

In FIG. 1, one or more RF modulated signals transmitted from one or more transmitters (e.g., base stations) are received by each of a number of (N) antennas 112a through 112n. In general, N can be any integer one or greater (i.e., N≧1) and is equal to two or more (i.e., N≧2) if receive diversity is employed. The received signal from each antenna 112 is provided to a respective receiver 114. Each receiver 114 amplifies a respective received signal with one or more low noise amplifier (LNA) stages, filters the amplified RF signal to remove noise and spurious signals, and quadrature downconverts the filtered RF signal to provide an inphase (I) and a quadrature (Q) baseband component for the received signal.

The I and Q baseband components from each receiver 114 are then digitized by a respective pair of analog-to-digital converters (ADCs) 116 to provide a stream of (complex) I and Q samples. In a specific embodiment, ADCs 116 provide I and Q samples at twice the chip rate (i.e., chipx2), with the chip rate being 1.2288 Mcps for some CDMA systems. The pair of I and Q samples for each chipx2 sample period is referred to herein as an ADC sample or a data sample. The stream of ADC samples from each pair of ADCs 116 is provided to a respective sample buffer 118 and stored.

A digital signal processor (DSP) 120 receives the ADC samples stored in sample buffers 118a through 118n and further processes the samples. DSP 120 may perform a number of functions such as filtering, resampling, demodulation, decoding, and so on. DSP 120 may also implement various control loops used to provide the proper sample timing for each received signal, as described in further detail below. A memory 122 may be used to provide storage for data and/or codes used by DSP 120.

Clock circuits 124 provide the clock signals used by various elements of receiver unit 100. For example, clock circuits 124 may be designed to provide the local oscillator (LO) signals for receivers 114a through 114n, and the sampling clocks for ADCs 116a through 116n. The frequency and/or phase of these various clock signals may be adjusted by one or more loop controls from DSP 120.

Figure 2:
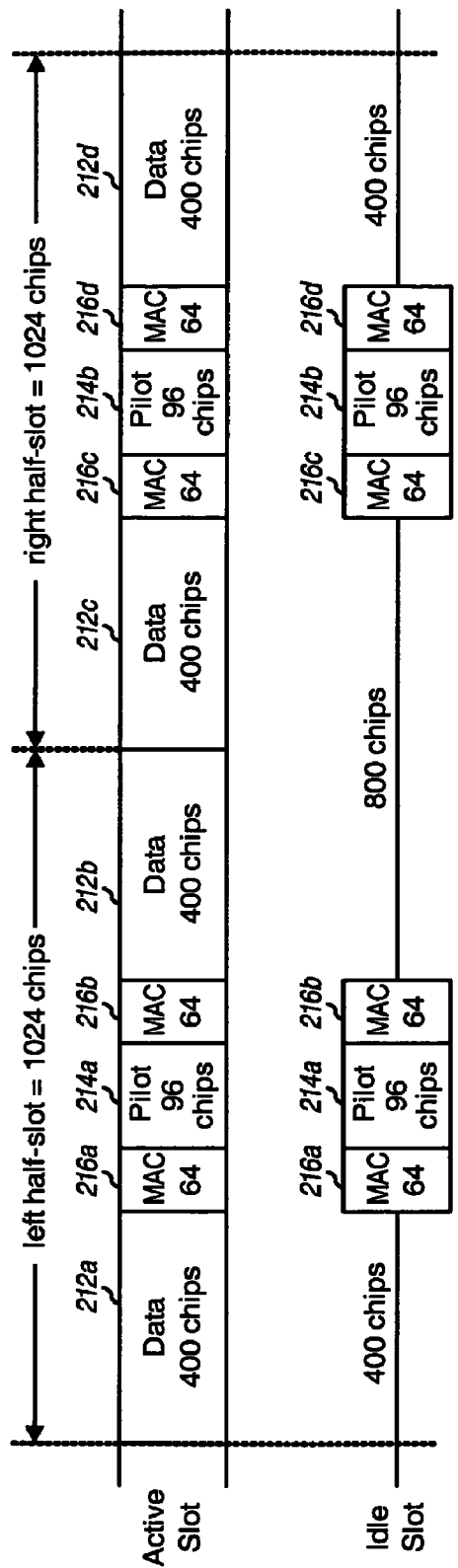
FIG. 2 is a diagram of a transmission (or slot) format defined by IS-856 for the forward link.

FIG. 2 is a diagram of a transmission (or slot) format defined by IS-856 for the forward link. Each active slot is divided into two half-slots, with each half-slot including two data partitions 212 separated by a pilot burst 214. Data partitions 212 may be used to transmit user-specific data and signaling, and pilot bursts 214 may be used to transmit a pilot. The left half-slot includes data partitions 212a and 212b separated by pilot burst 214a, and the right half-slot includes data partitions 212c and 212d separated by pilot burst 214b. For IS-856, each pilot burst 214 comprises 96 chips of all-zero data.

The left half-slot further includes two signaling bursts 216a and 216b placed on both sides of pilot burst 214a, and the right half-slot further includes signaling bursts 216c and 216d placed on both sides of pilot burst 214b. These signaling bursts 216 are used to implement a MAC channel that is used to transmit reverse power control (RPC) information and other information. The RPC information directs the terminals to adjust their transmit power either up or down to achieve the desired signal quality at the receiving base station.

Each idle slot is also divided into two half-slots, and each half-slot also includes one pilot burst 214 of the same width (e.g., 96 chips) and located in the same position in the half-slot as in the active slot. Two signaling bursts 216 (each of 64 chips in duration) are positioned on both sides of each pilot burst 214. The signaling bursts provide a transition period between no transmission and pilot transmission and between pilot transmission and no transmission. The transition period allows the pilot reference to reach or be near its steady state value for the duration of the (e.g., 96-chip) pilot burst. The pilot bursts for the idle slot are intended to be essentially indistinguishable from the pilot bursts for the active slot.

Figure 3:
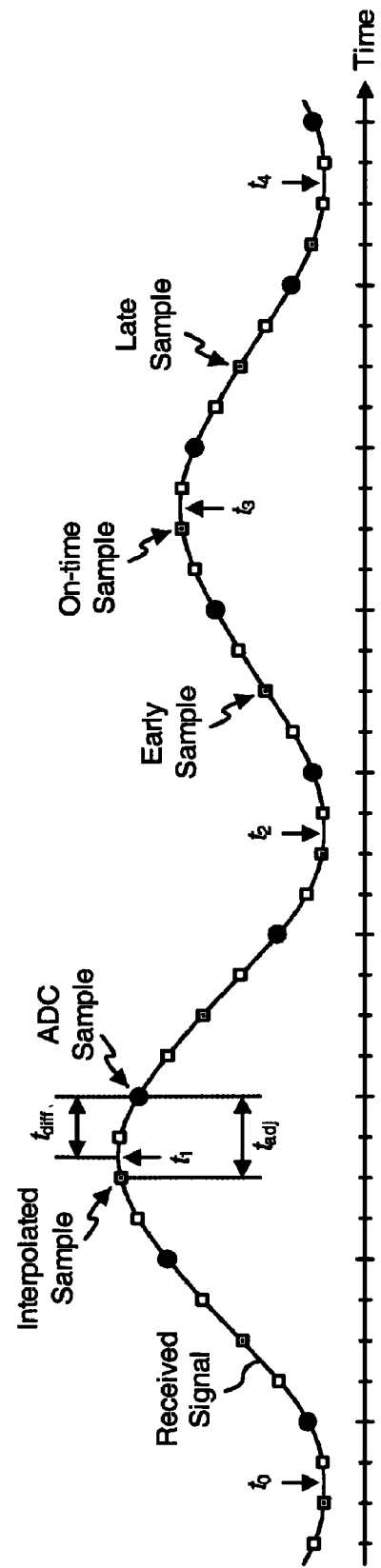
FIG. 3 graphically illustrates an embodiment of the resampling performed on the data samples to achieve higher time resolution.

FIG. 3 graphically illustrates an embodiment of the resampling performed on the ADC samples to achieve higher time resolution. The received signal from a particular antenna is typically oversampled at an initial sample rate that is multiple (e.g., 2, 4, or 8) times the chip rate to provide higher time resolution. The ADC samples may then be decimated down to twice the chip rate (i.e., chipx2) and stored to sample buffer 118. Storing chipx2 samples instead of higher rate (e.g., chipx8) samples reduces the buffer requirement.

To demodulate a particular signal instance in the received signal, the ADC samples are retrieved from the sample buffer and resampled to obtain interpolated samples at possibly the same sample rate (e.g., chipx2) but at a specific time offset corresponding to the arrival time of the signal instance at the receiver unit. This time offset is an approximation of the "optimum" sample timing that provides the highest signal-to-noise-and-interference ratio (SINR) for the signal instance. A delay lock loop (DLL) may be maintained for each signal instance being processed to provide the proper time offset for that signal instance. By using resampling, multiple signal instances with different arrival times in the received signal may be processed by resampling the same sequence of ADC samples at the specific time offsets determined for these signal instances.

As shown in FIG. 3, the received signal is effectively sampled at chipx2 and the ADC samples (which are represented by the solid circles) are stored to the sample buffer. For the specific signal instance shown in FIG. 3, the optimum sampling time instances occur at $t_0$, $t_1$, $t_2$, $t_3$, $t_4$, and so on. The ADC sample timing may not be locked to the optimum sample timing for a given signal instance, as shown in FIG. 3.

In a specific implementation, the resampling is performed at chipx8 time resolution (i.e., $T_c/8$, where $T_c$ is one chip period). In this case, with linear interpolation, each pair of chipx2 ADC samples may be resampled at three other possible discrete time instances, which are represented by the square boxes between the solid circles. The difference between the ADC sampling time instances and the optimum sampling time instances for the signal instance is denoted as $t_{diff}$ in FIG. 3. However, this value is quantized to chipx8 time resolution and results in a time offset of $t_{adj}$. The resampling is then performed based on the time offset, $t_{adj}$, to provide the interpolated samples for the signal instance, which are represented by the shaded square boxes.

Figure 4A:
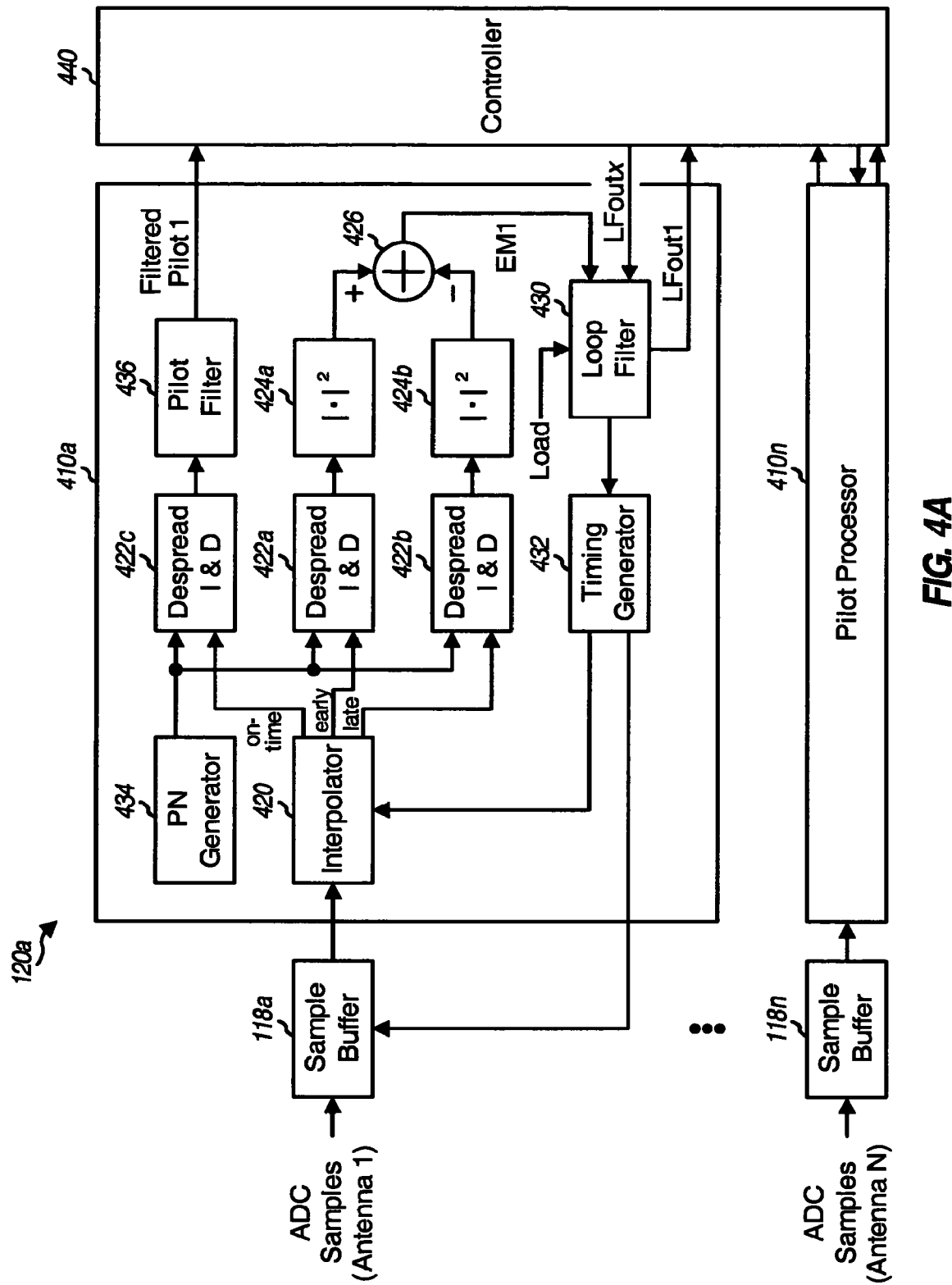
FIG. 4A is a block diagram of an embodiment of a DSP that includes a number of pilot processors, each with a loop filter for tracking the timing of the signal instance assigned to the pilot processor.

FIG. 4A is a block diagram of an embodiment of a DSP 120a that may be used to process the pilots in N received signals from N antennas. As shown in FIG. 1, the ADC samples for each received signal are provided to a respective sample buffer 118 and stored. N sample buffers may thus be used to store the ADC samples for N different received signals from N antennas. The ADC samples from each sample buffer may thereafter be retrieved and provided to one or more pilot processors 410, with each pilot processor being assigned to process a specific signal instance. Each pilot processor processes the pilot for its assigned signal instance to recover the timing and other information (e.g., the SINR) for that signal instance, as described below.

As noted above, each propagation path results in a signal instance appearing in each of the N received signals. For a given propagation path, N pilot processors 410a through 410n may thus be assigned to process the N signal instances in N different received signals corresponding to the propagation path. For simplicity, FIG. 4A shows the pilot processors assigned to process the signal instances for one propagation path.

FIG. 4A also shows a specific embodiment of pilot processor 410. Within each pilot processor 410, the ADC samples are provided to an interpolator 420 and resampled (as illustrated in FIG. 3) to provide interpolated samples for the signal instance being processed. The resampling is performed based on a timing control provided by a timing generator 432. This timing control indicates the specific time offset, $t_{adj}$, to be used for resampling the ADC samples, and is provided with a particular time resolution (e.g., chipx8 or $T_c/8$ resolution). For each chip period, interpolator 420 provides an "early" interpolated sample to a despread and integrate and dump (I & D) element 422a, a "late" interpolated sample to a despread I & D element 422b, and an "on-time" interpolated sample to a despread I & D element 422c. The early, late, and on-time samples have the timing relationship shown in FIG. 3 and are separated by $T_c/2$, although some other time differences beside $T_c/2$ may also be used and are within the scope of the invention.

A PN generator 434 also provides to each despread I & D element 422 a PN sequence having a specific PN state (or PN phase) corresponding to the arrival time of the signal instance being processed. This PN state may be determined by a searcher in its search for strong signal instances in the received signal and is provided to PN generator 434. Each despread I & D element 422 then despreads its received interpolated samples with the PN sequence to provide despread samples, and further decovers the despread samples with the channelization code used for the pilot. For many CDMA systems, the channelization code for the pilot is a sequence of zeros (e.g., Walsh code zero), in which case the decovering may be omitted. For the pilot structure shown in FIG. 2, each despread I & D element 422 further accumulates (i.e., integrates) the despread samples over a 96-chip period for each pilot burst to provide a pilot sample for the pilot burst (i.e., one pilot sample for each half-slot).

The pilot samples from despread I & D elements 422a and 422b are provided to magnitude squarers 424a and 424b, respectively. Each magnitude squarer 424 computes the energy of each pilot sample (which is a complex value denoted as $P_I+jP_Q$), as follows:

$$E_P = P_I^2 + P_Q^2. \quad \text{Eq (1)}$$

Magnitude squarer 424a provides the pilot energy, $E_{P,early}$, derived based on the early samples, and magnitude squarer 424b provides the pilot energy, $E_{P,late}$, derived based on the late samples. For each half-slot, a summer 426 subtracts the late pilot sample energy, $E_{P,late}$, from the early pilot sample energy, $E_{P,early}$, and provides the difference (i.e., $E_{p,early} - E_{P,late}$) to a loop filter 430.

Despread I & D elements 422a and 422b, magnitude squarers 424a and 424b, and summer 426 collectively form an early/late discriminator (or early/late detector) that is commonly used to estimate the instantaneous error in the sample timing. Other types of discriminator may also be used for a delay lock loop, and this is within the scope of the invention.

Loop filter 430 is part of a delay lock loop (DLL) implemented for the signal instance being processed. The output from summer 426 is an error metric, EM, derived based on early/late pilot energies and is indicative of the instantaneous error, Δt, in the sample timing for the signal instance. This error metric is filtered by loop filter 430 to provide a loop output indicative of the (fine-grain) error, $t_{diff}$, between the ADC sampling time instances and the optimum sampling time instances for this signal instance. Timing generator 432 then receives and quantizes the loop output to provide the (coarse-grain) time offset, $t_{adj}$, to be used for resampling the ADC samples. Timing generator 432 then provides to interpolator 420 the timing control indicative of the time offset, $t_{adj}$, and further provides to sample buffer 118 an address indicative of the specific ADC samples to be retrieved from the sample buffer.

The on-time pilot samples from despread I & D element 422c are provided to a pilot filter 436 and filtered based on a particular lowpass filter response to provide a filtered pilot. The filtered pilot is then provided to a controller 440 and may further be processed to provide an estimate of the pilot SINR. In much of the following description, the pilot SINR is used as an estimate of the signal quality of the signal instance. However, other metrics may also be used to estimate the signal quality of the signal instance, and this is within the scope of the invention. Despread I & D element 422c and pilot filter 436 are parts of a signal quality estimator used to estimate the SINR of a signal instance.

Figure 4B:
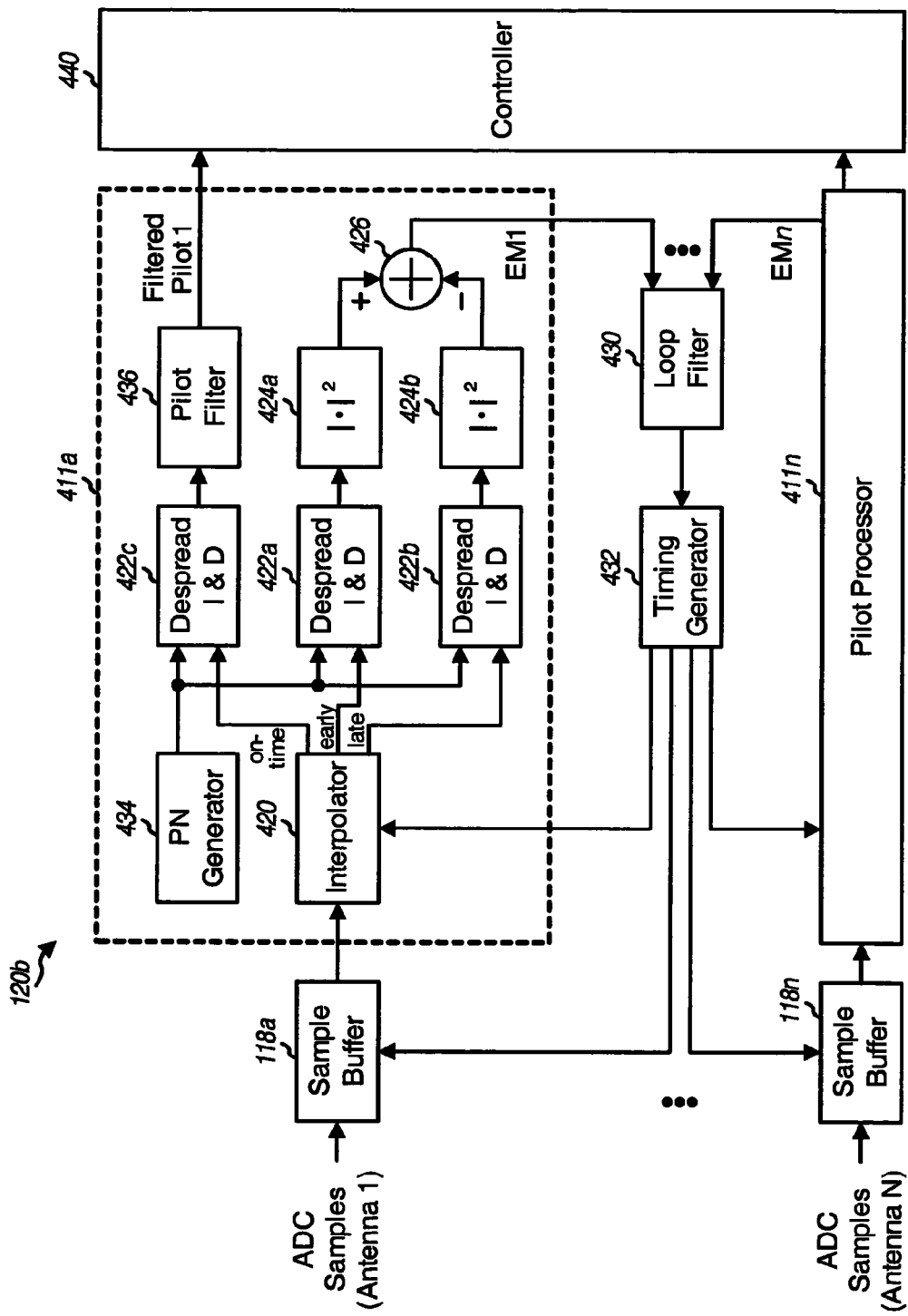
FIG. 4B is a block diagram of an embodiment of a DSP that includes a number of pilot processors and a single loop filter for tracking the timing of all signal instances of a given propagation path.

FIG. 4B is a block diagram of an embodiment of a DSP 120b wherein a single loop filter is provided for the delay lock loop for all N signal instances of a given propagation path. Similar to the embodiment shown in FIG. 4A, one pilot processor 411 may be used to process each signal instance received for the propagation path, and N pilot processors may thus be used for N signal instances received on N antennas for the propagation path. However, each pilot processor 411 does not include a loop filter or a timing generator to individually track the timing of its assigned signal instance. Instead, one loop filter 430 and one timing generator 432 are used to track (1) the timing of the best signal instance, (2) the average timing of all N signal instances, (3) the average timing of a subset of the N signal instances, or (4) some other timing. Timing generator 432 then provides the timing controls for interpolators 420 for all N pilot processors 411 and the addresses for all N sample buffers 118.

Figure 5A:
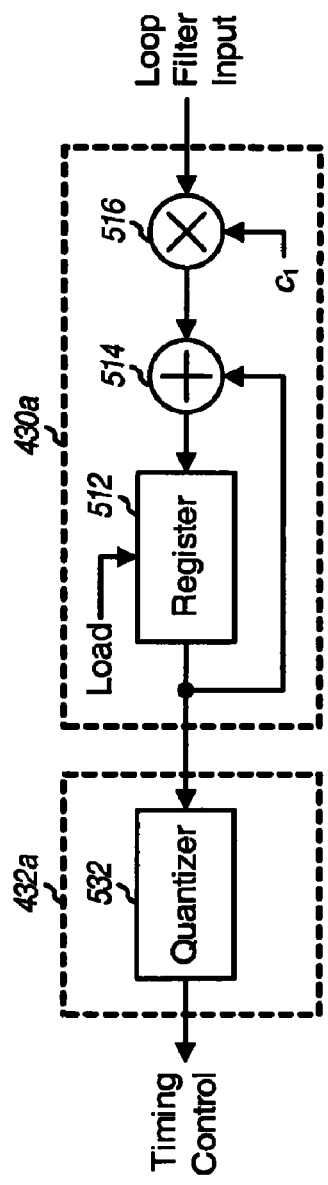
FIGS. 5A and 5B are block diagrams of an embodiment of a first-order loop filter and a second-order loop filter, respectively, for a delay lock loop.

FIG. 5A is a block diagram of an embodiment of a first-order loop filter 430a for a delay lock loop. Loop filter 430a may be used for loop filter 430 in FIG. 4A, and includes a single accumulator implemented with a register 512 and a summer 514. The loop filter input (which is the error metric, EM, from summer 426) is initially scaled with a scaling factor, $c_1$, by a multiplier 516, and the scaled value is then accumulated by the accumulator. The output from the accumulator comprises the loop output, LFout, which is provided to timing generator 432a. The loop output is indicative of the fine-grain timing difference, $t_{diff}$, between the ADC and optimum sampling time instances, and may have any number of bits of resolution. In an embodiment, the loop output is quantized to chipx8 time resolution by a quantizer 532 within timing generator 432a to provide the timing control (which is indicative of the coarse-grain time offset, $t_{adj}$) for interpolator 420.

Figure 5B:
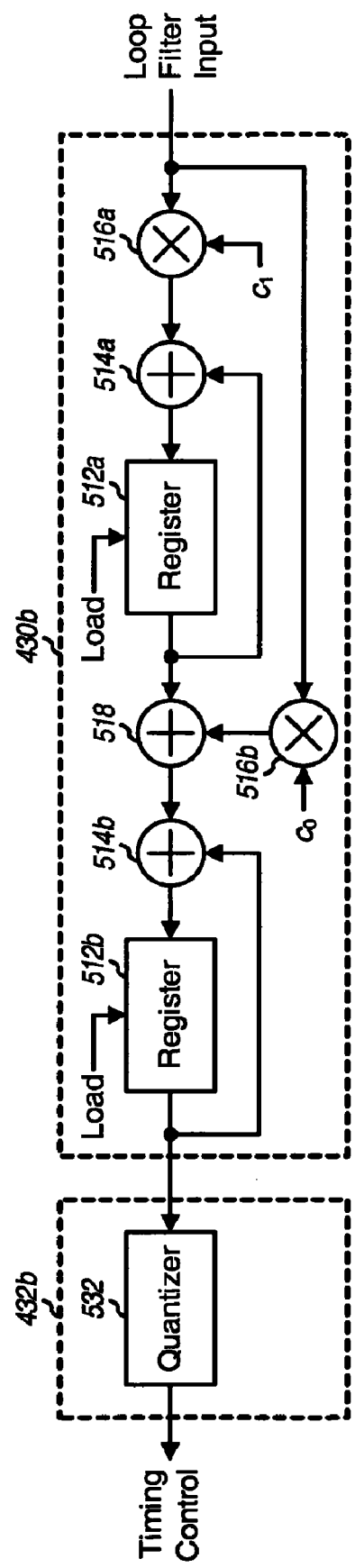

FIG. 5B is a block diagram of an embodiment of a second-order loop filter 430b for a delay lock loop. Loop filter 430b may also be used for loop filter 430 in FIG. 4A, but includes two accumulators. The first accumulator is implemented with a register 512a and a summer 514a, and the second accumulator is implemented with a register 512b and a summer 514b. The loop filter input is scaled with a scaling factor, $c_1$, by a multiplier 516a, and also scaled with a scaling factor, $c_0$, by a multiplier 516b. The scaled value from multiplier 516a is accumulated by the first accumulator. The output from the first accumulator and the scaled value from multiplier 516b are summed by a summer 518, and the summed value is further accumulated by the second accumulator. The output from the second accumulator comprises the loop output, LFout, which is provided to timing generator 432b. The first and second accumulators may each have any number of bits of resolution.

In general, each loop filter may be viewed as comprising a "loop accumulator" for accumulating the instantaneous timing errors estimated by the error metric, EM. For the first-order loop filter 430a, the loop accumulator comprises a single accumulator. And for the second-order loop filter 430b, the loop accumulator comprises the first and second accumulators.

The performance of a delay lock loop with an early-late discriminator (such as that shown in FIG. 4A) and with a first or second-order loop filter is described in various references available in the art. One such reference is a book by A. J. Viterbi, entitled "Principles of Spread Spectrum Multiple Access Communications," $2^{nd}$ Ed., McGraw Hill, 1977, which is incorporated herein by reference.

Diversity DLL

As noted above, when receive diversity is employed, N signal instances are received on N antennas for each propagation path. If the receive antennas are located in close proximity to one another, then these signal instances will be closely aligned in time. However, for a given propagation path, each receive antenna may be associated with different fading and multipath effects. Thus, these N signal instances may be associated with different (possibly wide ranging) amplitudes and phases.

Various schemes are provided herein to derive the "proper" sample timing for each propagation path when receive diversity is employed. Some of these schemes are described below.

In a first diversity DLL scheme, a DLL is maintained for each propagation path, and each DLL is operated to track the timing of the "best" signal instance for the assigned propagation path. For each propagation path, the sample timing for the remaining signal instances are "slaved" to the sample timing of the best signal instance. The best signal instance may be defined as the one with the best signal quality (i.e., the highest SINR) or the strongest signal strength. The SINR of a particular signal instance may be estimated based on the SINR of the pilot, which may in turn be estimated based on the pilot samples from despread I & D element 422c or the filtered pilot from pilot filter 436.

The first DLL scheme may be implemented using the pilot processor design shown in FIG. 4A whereby one loop filter 430 is included in each pilot processor 410. Each loop filter is initially updated based on the error metric, EM, derived for the assigned signal instance. The loop filter value for the best signal instance is then provided to the loop filters for the other signal instances, as described in further detail below.

Figure 6A:
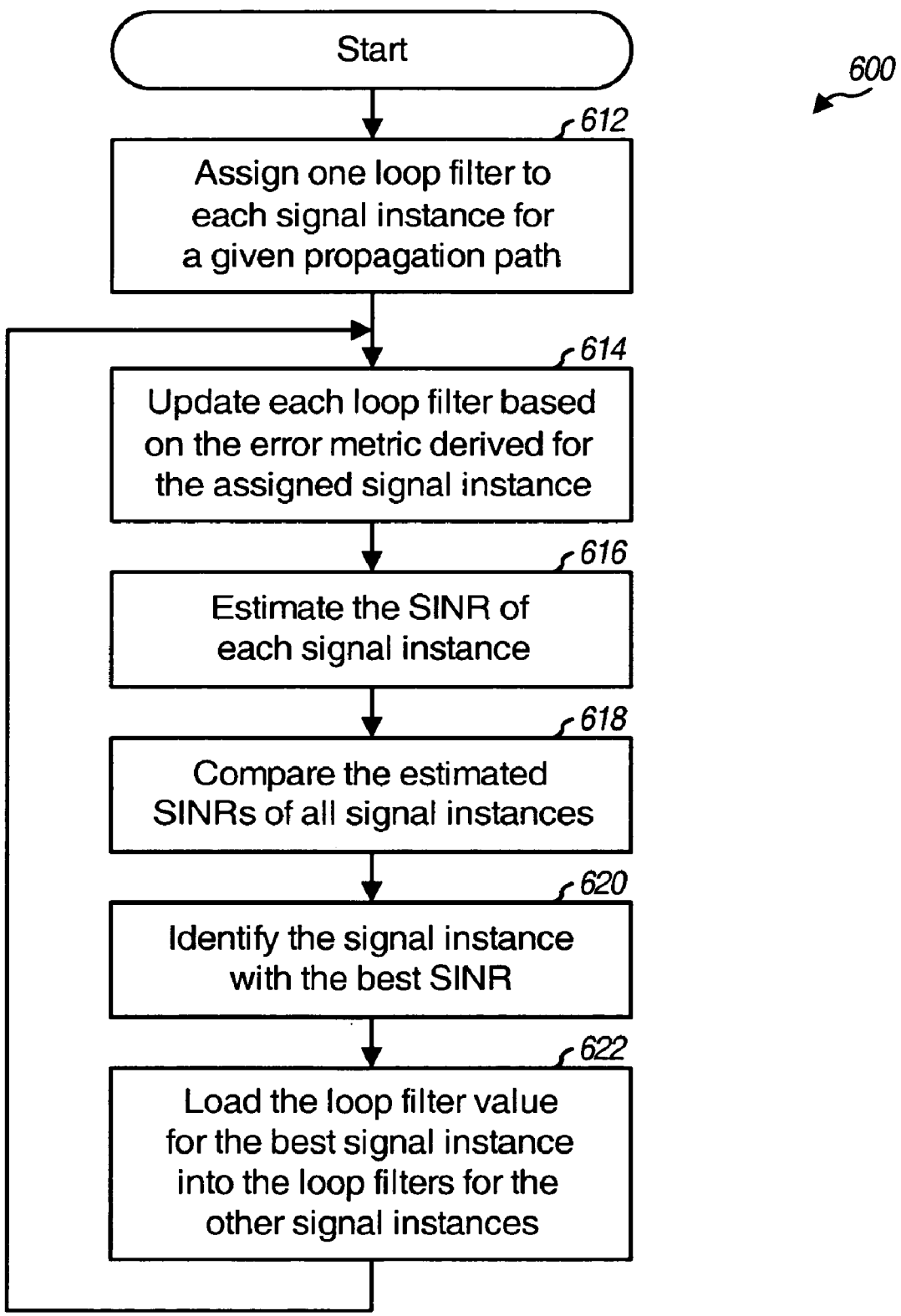
FIGS. 6A and 6B are flow diagrams of two embodiments of a process for deriving sample timing for a given propagation path based on the timing of the best signal instance.

FIG. 6A is a flow diagram of an embodiment of a process 600 for deriving the sample timing for a given propagation path based on the timing of the best signal instance. For this embodiment, one loop filter is assigned to each of the N signal instances for the propagation path being processed (step 612). Each loop filter is initially operated as if receive diversity is not employed, and thus updates its loop accumulator based on the error metric, EM, derived from the early/late pilot energies for the assigned signal instance, as described above for FIG. 4A (step 614). The SINR of each signal instance is also estimated (e.g., based on the pilot samples or the filtered pilot) (step 616).

After the N loop filters have been updated based on their respective error metrics derived from their respective sequences of ADC samples, the SINRs of all N signal instances are compared (e.g., by controller 440) (step 618). The signal instance with the best SINR is then identified as the best signal instance, and the loop filter value for this signal instance is then retrieved (step 620). The loop filter value is denoted as LFout in FIG. 4A and comprises the value(s) for register(s) 512 used to implement the loop accumulator. The loop filter value for the best signal instance (denoted as LFoutx in FIG. 4A) is then provided to the loop filters for the other (N−1) signal instances and loaded onto register(s) 512 of these loop filters (step 622). The process may be repeated each time a new error metric is derived, which may be every half-slot for the pilot structure shown in FIG. 2.

The first DLL scheme may also be implemented using the pilot processor design shown in FIG. 4B whereby one loop filter 430 is provided for N pilot processors 411. The loop filter is then updated based on the error metric, EM, derived for the best signal instance.

FIG. 5C is a block diagram of an embodiment of a first-order loop filter 430x that may be used to track the timing of the best signal instance for a given multipath. Loop filter 430x may be used for loop filter 430 in FIG. 4B and includes a single accumulator implemented with register 512 and summer 514. The error metrics, EMI through EMn, from N pilot processors 411 assigned to the N signal instances for the propagation path are provided to a multiplexer 520. Each error metric, EMi, is derived by a respective pilot processor 411 based on a respective sequence of ADC samples for the assigned signal instance. Multiplexer 520 also receives a control signal, Select, indicative of the best signal instance, selects the error metric, EMx, for the best signal instance, and provides the selected error metric, EMx, to multiplier 516. Register 512, summer 514, and multiplier 516 implement the first-order loop filter, as described above.

Figure 6B:
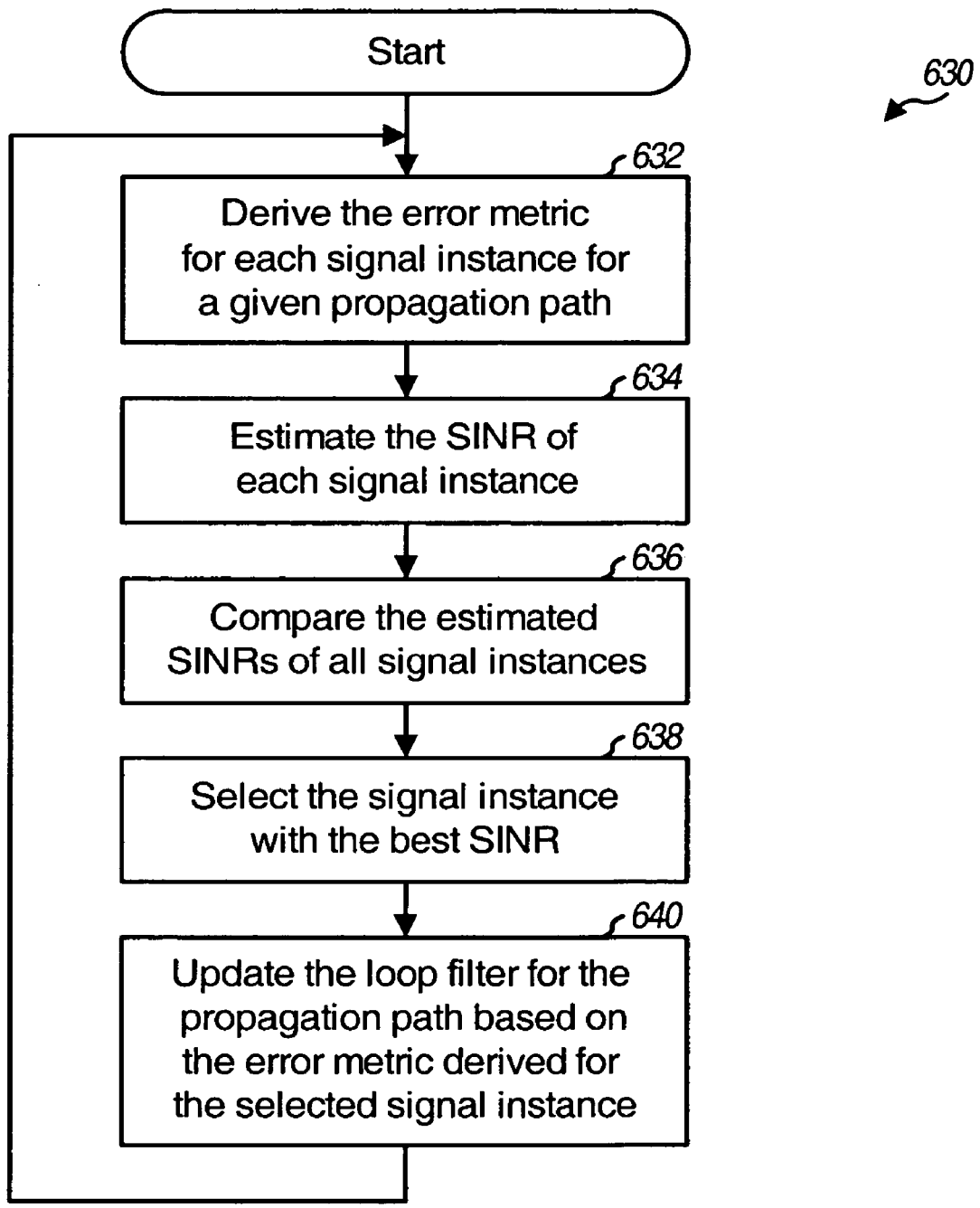

FIG. 6B is a flow diagram of another embodiment of a process 630 for deriving the sample timing for a given propagation path based on the timing of the best signal instance. For this embodiment, the design shown in FIGS. 4B and 5C may be used whereby one loop filter is maintained for all N signal instances of the propagation path being processed.

For each loop update period (e.g., each half-slot), the pilot processor for each signal instance derives the error metric, EMi, from the early/late pilot energies for the assigned signal instance in the manner described above (step 632). The SINR of each signal instance is also estimated (step 634). The SINRs of all N signal instances are then compared (e.g., by controller 440) (step 636). The signal instance with the best SINR is then identified as the best signal instance, and the error metric, EMx, for this signal instance is selected (step 638). The selected error metric, EMx, for the best signal instance is then provided to the loop filter and used to update the loop accumulator (step 640). The process may be repeated for each loop update period.

For the first DLL scheme, the timing of the best signal instance is used for the remaining signal instances. This scheme may provide improved performance if there is a large disparity in the SINRs of the N signal instances for a given propagation path, which may be the case in a multipath environment whereby signals may add constructively at one antenna and destructively at another antenna. As each of the signal instances received on the N antennas individually fades in and out, the timing of the best signal instance is retained and used for any new signal instance that becomes better.

In a second diversity DLL scheme, one DLL is maintained for each propagation path, and each DLL is operated to track the average timing of a set of signal instances for the assigned propagation path. This set may include all N signal instances or a subset of the N signal instances for the assigned propagation path. The second DLL scheme may be implemented using DSP 120b shown in FIG. 4B whereby one loop filter is maintained for all N signal instances of a given propagation path, with the loop filter being updated based on the error metrics derived for the selected signal instances. The second DLL scheme may provide improved sample timing by using the error metrics from multiple signal instances instead of just the best signal instance.

FIG. 5D is a block diagram of an embodiment of a first-order loop filter 430y that may be used to track the average timing of a set of selected signal instances for a given multipath. Loop filter 430y may be used for loop filter 430 in FIG. 4B and includes a single accumulator implemented with register 512 and summer 514. The error metrics, EMI through EMn, from N pilot processors 411 assigned to the N signal instances for this propagation path are provided to N multipliers 522a through 522n within loop filter 430y. Each error metric, EMi, is derived by a respective pilot processor 411 based on a respective sequence of ADC samples for the assigned signal instance.

Each multiplier 522 scales the received error metric, EMi, with a respective weight, $w_i$, and provides the scaled error metric to a summer 524. Summer 524 then sums the scaled error metrics for all N signal instances and provides the composite error metric, EMt, to multiplier 516. Register 512, summer 514, and multiplier 516 implement the first-order loop filter, as described above.

Various schemes may be used to weigh the N error metrics for all N signal instances to derive the composite error metric, EMt. In a first weighting scheme, the N error metrics are weighted by the signal quality of the signal instances (i.e., $w_i \propto SINRi$ for the i-th signal instance, where $i \in \{1, \ldots, N\}$). The composite error metric may then be expressed as:

$$EMt = \sum_{i=1}^{N} w_i \cdot EMi. \qquad \text{Eq (2)}$$

This weighting scheme results in the delay lock loop tracking more of the timing of the better signal instances.

In a second weighting scheme, the error metrics for the N signal instances are linearly combined (i.e., the same weight for all signal instances, or $w_i = 1.0$), as follows:

$$EMt = \sum_{i=1}^{N} EMi. \qquad \text{Eq (3)}$$

The second weighting scheme may provide improved performance in certain operating scenarios, such as if the SINRs of the N signal instances are within a particular range.

For all weighting schemes, the signal instances having poor SINRs may be totally excluded from the error metric combining. This may be achieved by comparing the SINR of each signal instance against a threshold SINR, and setting the weight and/or the error metric for the signal instance to zero (e.g., w=0.0) if its SINR is below the threshold SINR.

Figure 6C:
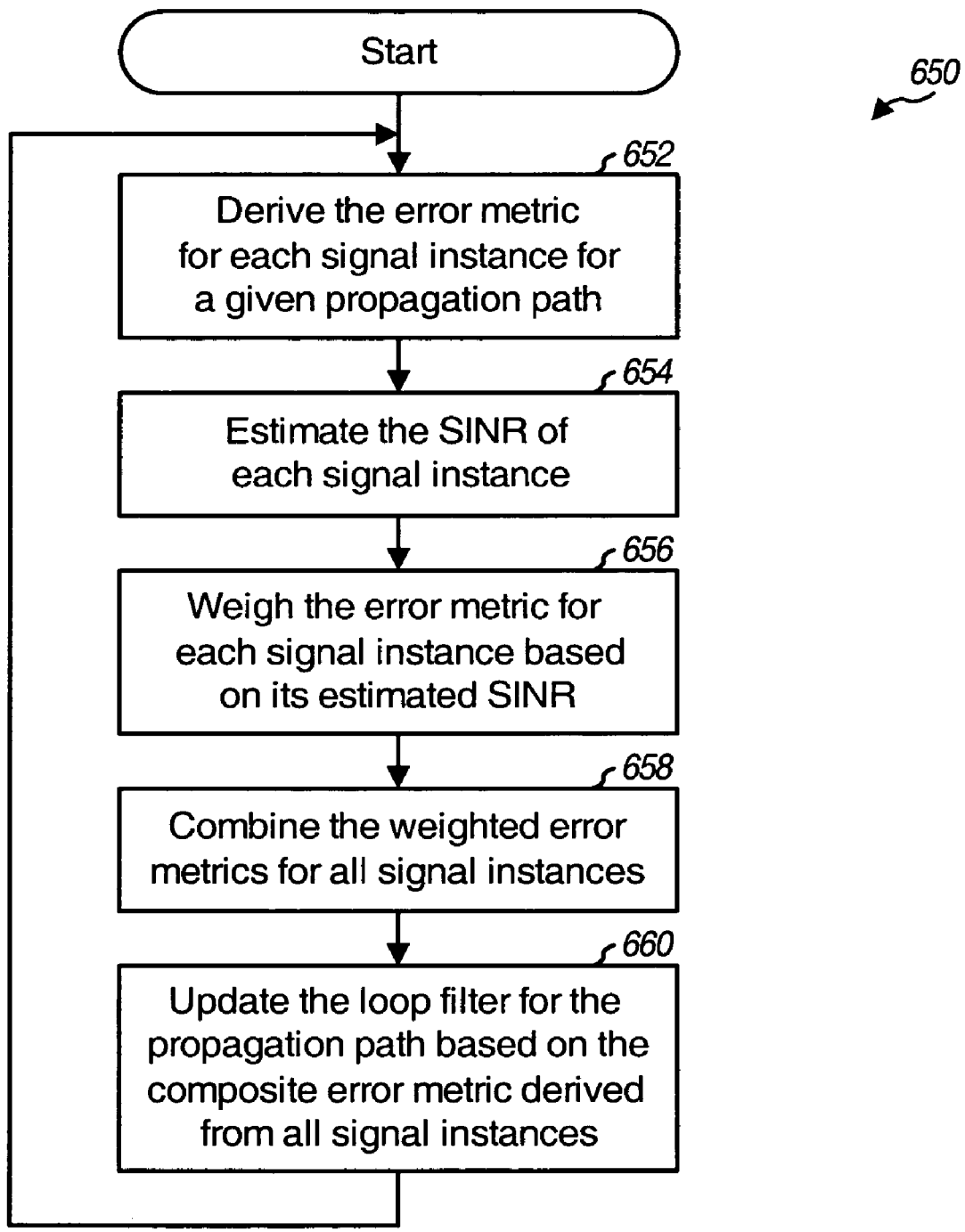
FIG. 6C is flow diagram of an embodiment of a process for deriving sample timing for a given propagation path based on the average timing of the signal instances.

FIG. 6C is a flow diagram of an embodiment of a process 650 for deriving the sample timing for a given propagation path based on the average timing of the selected signal instances. For this embodiment, the design shown in FIGS. 4B and 5C may be used whereby one loop filter is maintained for all N signal instances of the propagation path being processed.

For each loop update period (e.g., each half-slot), the pilot processor for each signal instance derives the error metric, EMi, from the early/late pilot energies for the assigned signal instance in the manner described above (step 652). The SINR of each signal instance is also estimated and may be used to derive a weight for the signal instance (step 654). The error metrics for the selected signal instances are weighted by their respective weights (step 656), and the weighted error metrics are combined to derive the composite error metric, EMt, for the current loop update period (step 658). The composite error metric, EMt, is then provided to the loop filter and used to update the loop accumulator (step 660). The process may be repeated for each loop update period.

In a third diversity DLL scheme, one DLL is maintained for each signal instance being processed, and each DLL is operated to track the individual timing of the assigned signal instance. This may be achieved by operating one loop filter for each signal instance, with each loop filter being operated independently and updated based solely on the error metric derived for its assigned signal instance. This DLL scheme may be implemented using the pilot processor design shown in FIG. 4A whereby one loop filter 430 is included in each pilot processor 410 and is used to track the timing of the assigned signal instance. However, the register(s) within each loop filter are not loaded with the loop filter value from another loop filter, as in the case for the first DLL scheme.

The third scheme may provide improved performance in certain operating scenarios, such as if there is a larger difference in the timing of the N signal instances for a given propagation path. In this case, tracking the individual timing of each signal instance, instead of tracking the timing of the best signal instance or tracking the average timing of all N signal instances, may provide improved performance.

In a fourth diversity DLL scheme, a number of different loop modes are supported. Each loop mode may correspond to a respective DLL scheme described above (e.g., the first and second loop modes may correspond to the first and second DLL schemes). The specific loop mode to use for tracking the timing of the N signal instances for a given propagation path may be dependent on the SINRs of these signal instances. For example, the timing of the best signal instance may be used for all signal instances (i.e., the first DLL scheme) if the SINR of the best signal instance exceeds the SINRs of all other signal instances by a particular amount (e.g., 4 dB). And if the above condition is not true, then the average timing of all N (or just the selected) signal instances for the propagation path may be used if the SINRs for these signal instances fall within a particular window (e.g., 6 dB).

Other DLL schemes may also be used for receive diversity, and this is within the scope of the invention.

DLL for Signals with High SINR

Some communication systems are designed to support high data rates for packet data and/or other services. One such communication system is the IS-856 system, which supports data rates ranging from 38.4 Kbps to 2.4576 Mbps on the forward link. Increasingly higher data rates require correspondingly higher SINR to achieve the target packet error rate (PER).

For a system designed to operate at high SINRs, such as the IS-856 system, errors or jitter in the sample timing may result in noticeable degradation in the signal SINR, which may then degrade demodulation and decoding performance. The timing errors or jitter may be exacerbated if the fine-grain timing difference, t ff, between the ADC and optimum sampling time instances, as determined by the loop filter, is subsequently quantized to a coarse (e.g., chipx8) time resolution to obtain the time offset, $t_{adj}$, used for resampling. In fact, it can be shown that quantization of the resample timing is one of the main reasons for DLL jitter, and the resulting performance degradation.

Referring back to FIG. 3, the optimum sampling time instances may fall between the possible discrete resample time instances, which may be derived based on a chipx8 clock in the example shown in FIG. 3. In this case, the resampling is performed at the chipx8 time instances closest to the optimum sampling time instances.

If the loop filter for a particular delay lock loop is driven solely by the error metric from the early/late discriminator, then the loop filter may dither one or more chipx8 periods in steady state. When the SINR of the received signal is high, the SINR of the demodulated symbols derived from the interpolated samples (i.e., the demodulated SINR) is sensitive to jitter in the sample timing caused by the dithering. In particular, the jitter in the sample timing leads to an increased variance in the demodulated SINR, which then results in a larger difference between the mean SINR and the 2% worst-case SINR. At higher data rates, the degraded demodulated SINR may result in a higher packet error rate. The system throughput may then be degraded due to (1) retransmission of the error packets, and (2) an increase in the back-off for the rate control. Thus, improved performance may be achieved if the sample timing jitter is reduced at high signal SINRs.

In an embodiment, a delay lock loop may be designed to support multiple operating modes, including a normal mode and an enhanced mode. If receive diversity is employed, then the enhanced mode may be entered, for example, if the SINR of any one of the N signal instances exceeds a particular threshold (e.g., 6 dB). In the enhanced mode, various techniques may be used to monitor the jitter of the loop filter and to adjust the sample timing only if it would result in better SINR for the signal instance.

The policy used to determine whether or not the DLL operates in the enhanced mode can be generalized. For example, the DLL may transition from the normal mode to the enhanced mode if the SINR exceeds a first threshold, $T_{rise}$. While in the enhanced mode, the DLL would transition back to the normal mode only if the SINR drops below a (usually lower) second threshold, $T_{fall}$, (i.e., $T_{fall}<T_{rise}$), and would remain in the enhanced mode otherwise. With this scheme, the transitions between the DLL operating modes are governed by SINR hysterisis, which prevents frequent toggling from one mode to another. Hysterisis may similarly be applied if more than two operating modes are used for the DLL.

Figure 4C:
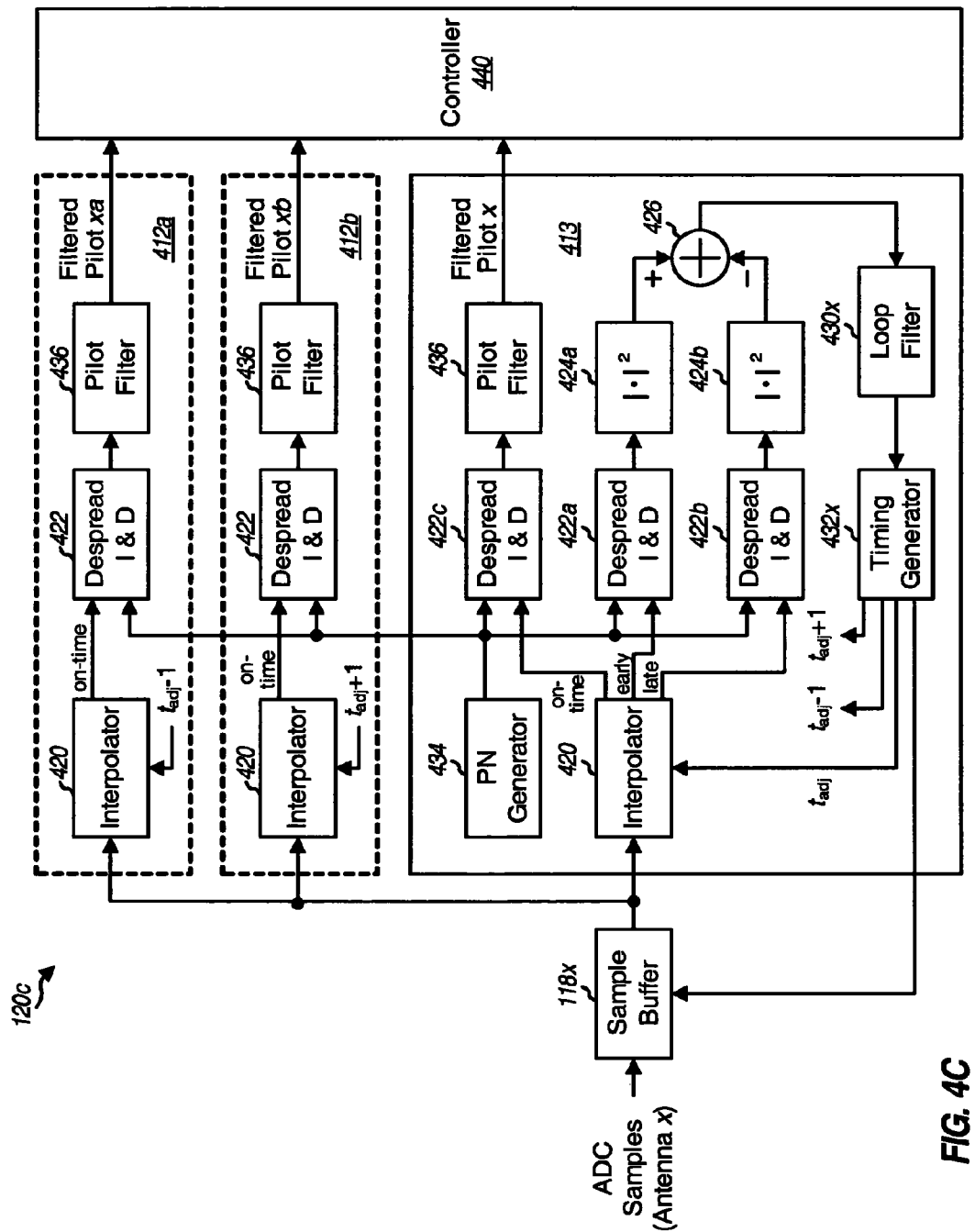
FIG. 4C is a block diagram of an embodiment of a DSP that includes a master pilot processor and two slave pilot processors used to reduce sample timing jitter.

FIG. 4C is a block diagram of an embodiment of a DSP 120*c* that may be used to reduce sample timing jitter for a received signal with high SINR. DSP 120*c* may be used to implement one embodiment of the enhanced mode for the delay lock loop. In this embodiment, two "slave" pilot processors 412*a* and 412*b* are assigned to a signal instance that achieves high SINR. These slave pilot processors are used in conjunction with a "master" pilot processor 413 also assigned to process the signal instance. The master finger processor may be implemented with pilot processor 410 or 411, depending on the specific design of DSP 120*c*.

Slave pilot processors 412*a* and 412*b* are used to process the ADC samples to determine the pilot SINR at two time offsets that are different from the time offset associated with the master pilot processor. In an embodiment, slave pilot processors 412*a* and 412*b* are assigned offsets of +1 chipx8 period and −1 chipx8 period, respectively. Each slave pilot processor 412 receives a respective "modified" time offset, $t_{adj,s}$, for the signal instance, which may be obtained by adding or subtracting one chipx8 unit to or from the "nominal"

time offset, $t_{adj}$, derived for the signal instance by the master pilot processor. The modified time offsets provided to slave pilot processors 412a and 412b may thus be derived as $t_{adj,s1}=t_{adj}-1$ and $t_{adj,s2}=t_{adj}+1$, respectively.

Within each slave pilot processor 412, interpolator 420 resamples the ADC samples based on the modified time offset, $t_{adj,s}$. Despread I & D element 422 then (1) despreads the interpolated samples with the PN sequence (the same PN sequence is provided to the master and slave pilot processors assigned to process a given signal instance), (2) accumulates the despread samples over each pilot burst, and (3) provides a pilot sample for the pilot burst based on the interpolated samples at the modified time offset. The pilot samples from despread I & D element 422 are then filtered by pilot filter 436 to provide a filtered pilot for the modified time offset. The filtered pilots from slave pilot processors 412a and 414b are provided to controller 440 and may further be processed to provide an estimate of the pilot SINRs for the modified time offsets of $t_{adj,s1}$ and $t_{adj,s2}$. Slave pilot processors 412a and 412b are thus used to determine the pilot SINRs at ±1 chipx8 unit from the time offset, $t_{adj}$, determined by the master pilot processor.

Figure 6D:
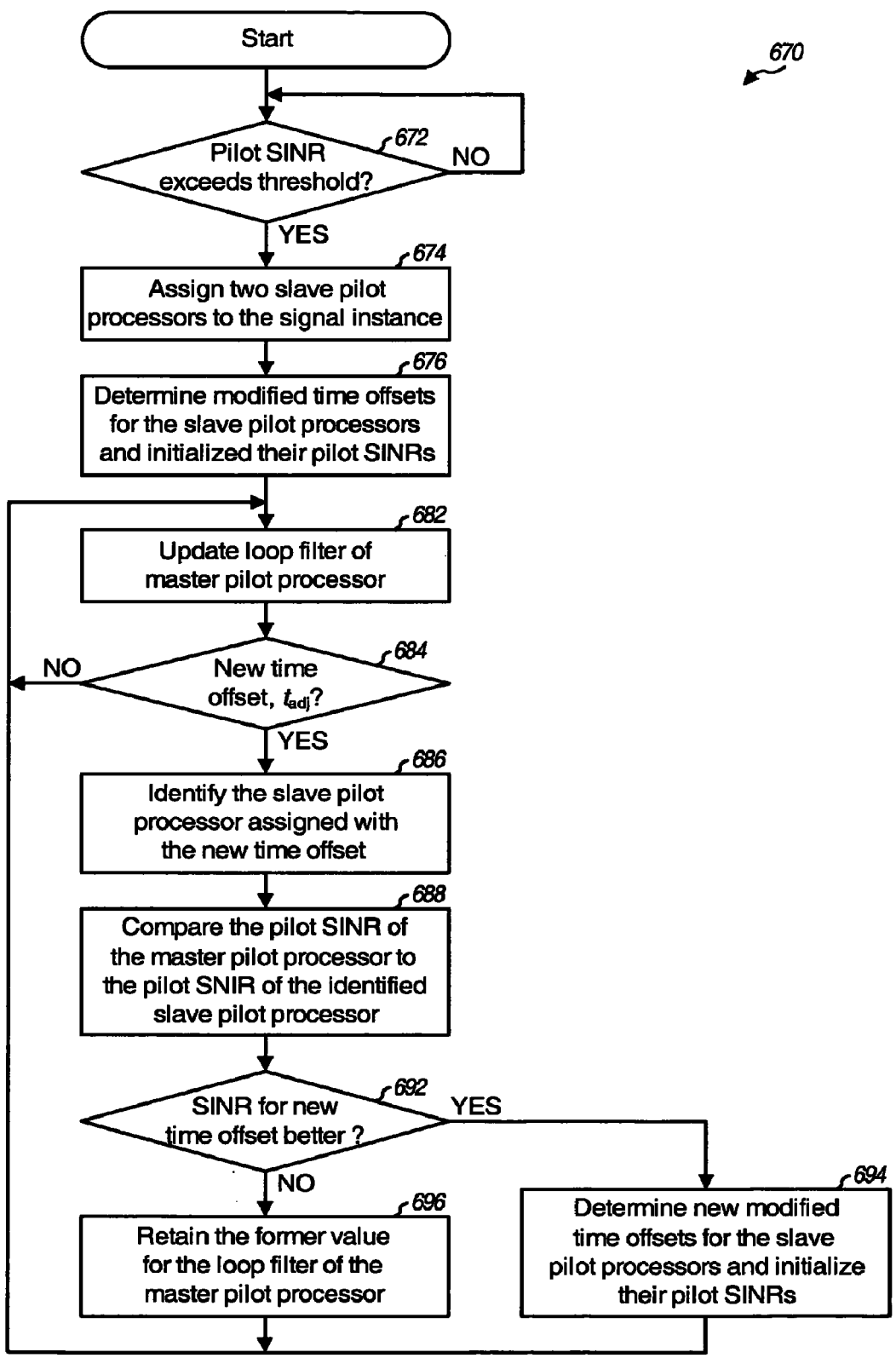
FIG. 6D is a flow diagram of an embodiment of a process for deriving sample timing with reduced jitter for a received signal instance.

FIG. 6D is a flow diagram of a specific embodiment of a process 670 for deriving sample timing with reduced jitter for a received signal instance. Initially, a determination is made whether or not the pilot SINR for the signal instance is greater than a particular threshold (step 672). If the answer is no, then the process returns to step 672. Otherwise, if the pilot SINR is greater than the threshold, then the delay lock loop enters the enhanced mode and two slave pilot processors are assigned to the signal instance (step 674). The modified time offsets for these slave pilot processors are then determined, and the pilot SINRs of the slave pilot processors are also initialized (step 676). Because measurement noise could cause the pilot SINR of a slave pilot processor to be momentarily larger than that of the master pilot processor, which may possibly lead to DLL jitter, the pilot SINRs of the slave pilot processors may be set equal to the pilot SINR of the master pilot processor minus a particular amount.

The loop filter of the master pilot processor is updated for each loop update period (e.g., every half-slot) based on the error metric derived by the early/late discriminator of the master pilot processor (step 682). The output of the loop filter is monitored for jitter. If the loop filter output implies retention of the current time offset, $t_{adj}$, (step 684), then no additional processing is required and the process returns to step 682. Otherwise, if the loop filter output implies a change in the time offset, $t_{adj}$, to a new value that is either +1 or −1 chipx8 unit away from the prior value (step 684), then the slave pilot processor corresponding to the new time offset is identified (step 686). The pilot SINR of the master pilot processor is then compared against the pilot SINR of the identified slave pilot processor, which was previously assigned with the new time offset (step 688).

If the pilot SINR of the identified slave pilot processor is deemed to be better than the pilot SINR of the master pilot processor (step 692), then the sample timing for the signal instance is allowed to be updated in the normal manner. In an embodiment, the new time offset is deemed to be better if the pilot SINR of the identified slave pilot processor is greater than the pilot SINR of the master pilot processor by a particular delta amount (e.g., by y dB). This delta amount is used to provide hysteresis so that the "better" time offset is not continually toggled between two offset values and to provide some level of immunity to measurement noise. New modified time offsets are then determined for the slave pilot processors based on the new nominal time offset (step 694). The pilot SINRs of the slave pilot processors are also initialized to reflect their assignments with the new modified time offsets.

Otherwise, if the new time offset is deemed to not be better (e.g., does not provide the requisite amount of improvement in the pilot SINR) (step 692), then the sample timing for the signal instance is not allowed to be updated. The former loop filter value is retained (e.g., by reversing the prior update to the loop filter) and the time offset, $t_{adj}$, is left unchanged (step 696). The process then returns to step 682 where the loop filter is updated at the next loop update period.

In FIG. 6D, the DLL enters the enhanced mode if the pilot SINR exceeds the threshold. In another embodiment, the DLL is operated in the enhanced mode based on some other criterion (e.g., if higher data rates are used for data transmission). The DLL may also be operated in the normal mode during timing acquisition and thereafter switched to the enhanced mode during tracking.

The enhanced mode described above may be used whether or not receive diversity is employed. If receive diversity is employed, then the SINR of the propagation path (i.e., the path SINR) may be used to determine whether or not to enter the enhanced mode. The path SINR refers to the SINR of the combined output of all N pilot processors assigned to the N signal instances for the propagation path. Alternatively, the SINR of the best signal instance may also be used to determine whether or not to enter the enhanced mode.

In the above description, a specific design for the DLL is used whereby each received signal is sampled based on a sampling clock having an arbitrary timing phase (i.e., with respect to the optimum sampling time). Resampling is then performed to obtain interpolated samples at the "optimum" sampling time instances, which are determined by the delay lock loop for the signal instance being processed.

In another DLL design, the phase of the sampling clock is adjusted by the delay lock loop for a selected signal instance in the received signal (e.g., the strongest signal instance). For this DLL design, the selected signal instance would then be sampled at or near its optimum sampling time, and resampling would not be needed for this signal instance. This DLL design can reduce the amount of jitter in the sample timing for the selected signal instance, which may improve the SINR of the demodulated data. Resampling may be used for the other signal instances in the received signal.

Any one of the diversity DLL schemes described above may also be used in conjunction with this alternative DLL design. For example, the sampling clocks for all N received signals may be adjusted based on the optimum sample timing for the best signal instance from among all signal instances in the N received signals (i.e., the first diversity DLL scheme). Resampling is then not needed for the N signal instances corresponding to the propagation path with the best signal instance. The sampling clocks may also be adjusted based on the average sample timing of the N signal instances for the propagation path with the best signal instance (i.e., the second diversity DLL scheme). The sampling clock for each received signal may also be individually adjusted based on the sample timing for the best signal instance on that received signal (i.e., the third diversity DLL scheme).

The delay lock loops and timing recovery techniques described herein may be implemented by various means. For example, a delay lock loop may be implemented in hardware, software, or a combination thereof. For a hardware implementation, the elements used to implement one or more delay lock loops may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described herein, or a combination thereof. A DSP may also be designed with the capability to implement multiple pilot processors in parallel or in a time division-multiplexed (TDM) manner.

For a software implementation, all or portions of the delay lock loops and/or certain timing recovery techniques may be implemented with modules (e.g., procedures, functions, and so on) that perform the functions described herein. The software codes may be stored in a memory unit (e.g., memory 122 in FIG. 1) and executed by a processor (e.g., DSP 120). The memory unit may be implemented within the processor or external to the processor, in which case it can be communicatively coupled to the processor via various means as is known in the art.

The delay lock loops may also be implemented with a combination of hardware and software. For example, hardware may be used to derive the error metrics and generate the timing controls, and software may be used to implement the loop filters.

Headings are included herein for reference and to aid in locating certain sections. These headings are not intended to limit the scope of the concepts described therein under, and these concepts may have applicability in other sections throughout the entire specification.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A method for deriving sample timing for a plurality of signal instances received on a plurality of antennas at a receiver unit in a wireless communication system, comprising:
    deriving an error metric from a signal energy for each of the plurality of signal instances received on a corresponding one of the plurality of antennas, the plurality of signal instances being different multi-path propagation instances of a transmitted first wireless signal, wherein each signal instance includes pilot samples, wherein deriving the error metric for each signal instance comprises subtracting energy of late pilot samples from energy of early pilot samples for each of the plurality of signal instances;
    combining error metrics for the plurality of signal instances received on the plurality of antennas for each update period to provide a composite error metric for the update period, wherein each error metric is weighted based on a signal quality of each signal instance;
    updating a loop filter based on the composite error metric;
    deriving a first sample timing for the plurality of signal instances based on an output of the loop filter;
    applying the same first sample timing to each of the plurality of signal instances, wherein the sample timing comprises one of the following:
        a timing for the best signal instance from among the plurality of signal instances;
        an average timing of the plurality of signal instances; or
        an average timing of a subset of the plurality of signal instances; and
    combining the plurality of signal instances after applying the first sample timing to them to reconstruct a version of the first wireless signal.

2. The method of claim 1, wherein said combining step includes combining error metrics for signal instances having estimated signal qualities above a particular threshold.

3. The method of claim 1, wherein the signal quality of each signal instance includes a signal-to-noise-and-interference ratio (SINR).

4. The method of claim 1, wherein the error metric for each signal instance is derived with an early/late discriminator and based on data samples for the signal instance.

5. An apparatus adapted for deriving sample timing for a plurality of signal instances received on a plurality of antennas at a receiver unit in a wireless communication system, comprising:
    means for deriving an error metric from a signal energy for each of the plurality of signal instances received on a corresponding one of the plurality of antenna, the plurality of signal instances being different multi-path propagation instances of a transmitted first wireless signal, wherein each signal instance includes pilot samples, wherein deriving the error metric for each signal instance comprises subtracting energy of late pilot samples from energy of early pilot samples for each of the plurality of signal instances;
    means for combining error metrics, in a loop filter, for the plurality of signal instances received on the plurality of antennas for each update period to provide a composite error metric for the update period, wherein each error metric is weighted based on a signal quality of each signal instance, wherein the loop filter is updated based on the composite error metric;
    means for deriving a first sample timing for the plurality of signal instances based on an output of the loop filter;
    means for applying the same first sample timing to each of the plurality of signal instances, wherein the sample timing comprises one of:
    a timing for the best signal instance from among the plurality of signal instances;
    an average timing of the plurality of signal instances; or
    an average timing of a subset of the plurality of signal instances; and
    means for combining the plurality of signal instances after applying the first sample timing to them to reconstruct a version of the first wireless signal.

6. The apparatus of claim 5, wherein said means for combining combines error metrics for signal instances having estimated signal qualities above a particular threshold.

7. The apparatus of claim 5, wherein the signal quality of each signal instance includes a signal-to-noise-and-interference ratio (SINR).

8. The apparatus of claim 5, wherein said means for deriving an error metric includes an early/late discriminator and said error metric is derived based on data samples for the signal instance.

9. An apparatus comprising:
    a processor configured to
        derive an error metric from a signal energy for each of the plurality of signal instances received on a corresponding one of the plurality of antennas, the plurality of signal instances being different multi-path propagation instances of a transmitted first wireless signal, wherein each signal instance includes pilot samples, wherein deriving the error metric for each signal instance comprises subtracting energy of late pilot samples from energy of early pilot samples for each of the plurality of signal instances;

combine error metrics for the plurality of signal instances received on the plurality of antennas for each update period to provide a composite error metric for the update period, wherein each error metric is weighted based on a signal quality of each signal instance;

update a loop filter based on the composite error metric, wherein the loop filter is implemented by the processor;

derive a first sample timing for the plurality of signal instances based on an output of the loop filter;

apply the same first sample timing to each of the plurality of signal instances, wherein the sample timing comprises one of:
- a timing for the best signal instance from among the plurality of signal instances;
- an average timing of the plurality of signal instances; or
- an average timing of a subset of the plurality of signal instances; and combine the plurality of signal instances after applying the first sample timing to them to reconstruct a version of the first wireless signal.

10. A method for deriving sample timing for a plurality of signal instances received on a plurality of antennas at a receiver unit in a wireless communication system, comprising:

deriving an error metric from a signal energy for each of the plurality of signal instances received on a corresponding one of the plurality of antennas, the plurality of signal instances being different multi-path propagation instances of a transmitted first wireless signal, wherein each signal instance includes pilot samples, wherein deriving the error metric for each signal instance comprises subtracting energy of late pilot samples from energy of early pilot samples for each of the plurality of signal instances;

combining error metrics for the plurality of signal instances received on the plurality of antennas for each update period to provide a composite error metric for the update period, wherein each error metric is weighted based on a signal quality of each signal instance;

updating a loop filter based on the composite error metric;

deriving a first sample timing for the plurality of signal instances based on an output of the loop filter;

applying the same first sample timing to each of the plurality of signal instances, wherein the sample timing comprises a timing for the best signal instance from among the plurality of signal instances; and combining the plurality of signal instances after applying the first sample timing to them to reconstruct a version of the first wireless signal.

11. A method for deriving sample timing for a plurality of signal instances received on a plurality of antennas at a receiver unit in a wireless communication system, comprising:

deriving an error metric from a signal energy for each of the plurality of signal instances received on a corresponding one of the plurality of antennas, the plurality of signal instances being different multi-path propagation instances of a transmitted first wireless signal, wherein each signal instance includes pilot samples, wherein deriving the error metric for each signal instance comprises subtracting energy of late pilot samples from energy of early pilot samples for each of the plurality of signal instances;

combining error metrics for the plurality of signal instances received on the plurality of antennas for each update period to provide a composite error metric for the update period, wherein each error metric is weighted based on a signal quality of each signal instance;

updating a loop filter based on the composite error metric;

deriving a first sample timing for the plurality of signal instances based on an output of the loop filter;

applying the same first sample timing to each of the plurality of signal instances, wherein the sample timing comprises an average timing of the plurality of signal instances; and combining the plurality of signal instances after applying the first sample timing to them to reconstruct a version of the first wireless signal.

12. A method for deriving sample timing for a plurality of signal instances received on a plurality of antennas at a receiver unit in a wireless communication system, comprising:

deriving an error metric from a signal energy for each of the plurality of signal instances received on a corresponding one of the plurality of antennas, the plurality of signal instances being different multi-path propagation instances of a transmitted first wireless signal, wherein each signal instance includes pilot samples, wherein deriving the error metric for each signal instance comprises subtracting energy of late pilot samples from energy of early pilot samples for each of the plurality of signal instances;

combining error metrics for the plurality of signal instances received on the plurality of antennas for each update period to provide a composite error metric for the update period, wherein each error metric is weighted based on a signal quality of each signal instance;

updating a loop filter based on the composite error metric;

deriving a first sample timing for the plurality of signal instances based on an output of the loop filter;

applying the same first sample timing to each of the plurality of signal instances, wherein the sample timing comprises an average timing of a subset of the plurality of signal instances; and combining the plurality of signal instances after applying the first sample timing to them to reconstruct a version of the first wireless signal.

* * * * *